United States Patent [19]
Post et al.

[11] Patent Number: 5,525,936
[45] Date of Patent: Jun. 11, 1996

[54] TEMPERATURE-COMPENSATED OSCILLATOR CIRCUIT

[75] Inventors: Reinder L. Post; Petrus J. M. Kamp, both of Rosmalen, Netherlands

[73] Assignee: Sierra Semiconductors B.V., S-Hertogenbosch, Netherlands

[21] Appl. No.: 379,461

[22] PCT Filed: Jun. 29, 1993

[86] PCT No.: PCT/NL93/00135

§ 371 Date: May 23, 1995

§ 102(e) Date: May 23, 1995

[87] PCT Pub. No.: WO94/03980

PCT Pub. Date: Feb. 17, 1994

[30] Foreign Application Priority Data

Jul. 29, 1992 [NL] Netherlands .............................. 9201372

[51] Int. Cl.$^6$ ................................. H03B 5/36; H03L 1/02
[52] U.S. Cl. ...................... 331/47; 331/116 FE; 331/158; 331/176
[58] Field of Search ...................... 331/158, 176, 331/47, 116 R, 116 FE

[56] References Cited

U.S. PATENT DOCUMENTS

| 4,859,969 | 8/1989 | Malinowski et al. | 331/43 |
| 4,872,765 | 10/1989 | Schodowski | 331/116 R |
| 5,004,987 | 4/1991 | Hurley | 331/70 |
| 5,200,714 | 4/1993 | Hayashi | 331/176 |

FOREIGN PATENT DOCUMENTS

| 3822407 | 2/1989 | Germany . |
| 55-163481 | 12/1980 | Japan . |
| WO90/15483 | 12/1990 | WIPO . |

Primary Examiner—Siegfried H. Grimm
Attorney, Agent, or Firm—Young & Thompson

[57] ABSTRACT

A temperature compensated oscillator circuit includes an oscillator (1) which is controlled by a processor (8). The output frequency (fx) of the oscillator (1) or an external reference frequency (fref) are used as reference signal in conjunction with a dual mode oscillator (9) which can be switched to provide temperature dependent fundamental (f1) and third (f3) harmonic frequencies. By the use of switches (S1, S2 S3), a divider (2) and first and second counters (3, 10) both calibration and temperature compensation of the oscillator (1) are carried out via the processor (8), using the substantially linear temperature dependence of the frequency difference between the third harmonic (f3) and three times the fundamental frequency (3f1).

9 Claims, 4 Drawing Sheets

TEMPERATURE-COMPENSATED OSCILLATOR CIRCUIT

The invention relates to a temperature-compensated oscillator circuit comprising an oscillator the output frequency of which has to be controlled, a processor the output of which is connected to the oscillator, counter means connected to at least one input of the processor and to temperature detecting oscillator means which are able to generate a temperature dependent signal.

Such a dual mode oscillator is known from DE-A-3.822.407.

Generally, crystal oscillators having a very high temperature stability are provided with a temperature compensating circuit. Such a circuit used to comprise a temperature sensor, a varicap and a control circuit, that could be analogue or digital. The calibration of such circuits in a temperature controlled measurement area took considerable time because the temperature-frequency characteristic is a function of higher order and, therefore, many points of the characteristic had to be measured. Moreover, because of limitations of a mechanical nature, the temperature-sensor needed for such a system, was always located at a distance from the crystal. Therefore, during the calibration procedure one had to observe a waiting time to guarantee the sensor and the crystal to have equal temperatures.

The temperature-compensated oscillator circuit according to DE-A3.822.407 mentioned above comprises a temperature detecting oscillator the frequency of which depends on the temperature. This circuit solves the problem of the waiting time during the calibration phase, however, the problem of non-linear relationship between the measured temperature and the frequency remains.

It is known as such that in oscillating crystals the frequency difference between a third harmonic frequency and three times the fundamental harmonic (f3—3*f1) exhibits a substantial linear temperature dependency. This feature is often used in temperature-compensated oscillator circuits, in, which, then, a dual mode oscillator is used which is able to oscillate on both the fundamental frequency and its third harmonic.

US-A-4.859.969 discloses a dual mode oscillator able to oscillate on both the fundamental frequency and its third harmonic. Such a dual mode oscillator is indicated to be suitable for use in clock driving circuits. However, a disadvantage of such a known dual mode oscillator is that a number of higher order filters is needed for the crystal to oscillate on both frequencies and to separate both signals afterwards. Because of these filters the circuit may only be integrated in a limited way.

The temperature-compensated oscillator circuit according to the invention is characterized in that the counter means comprises a first counter and a second counter, the input of the first counter being switchable through a first switch between first reference frequency means able to generate a first signal with a predetermined reference frequency and second reference frequency means able to generate a second signal with a reference equal to the predetermined reference frequency divided by three, the second counter being connected to said temperature detecting oscillator means which comprises a dual mode oscillator comprising a second, electronically controllable switch switchable between a first and a second state, wherein, during operation, said temperature detecting oscillator means will generate a third signal with a predetermined fundamental frequency in the first state and a fourth signal with a frequency substantially equal to the third harmonic of said fundamental frequency in the second state.

By the application of these features the linear temperature dependency of the difference between the frequency of the third harmonic and three times the fundamental frequency can be used both to control the temperature dependent oscillator and to calibrate it. The circuit according to the invention does not show the disadvantage of known dual mode oscillators as temperature detector means, e.g., as disclosed in US-A-4.859.969, since due to the switching capability between either an oscillation with the fundamental frequency or its third harmonic frequency no filters are needed to separate said frequencies.

A fast calibration of the circuit can be achieved, and moreover, the circuit may be integrated in CMOS-technology.

The first reference frequency means may comprise the oscillator the output frequency of which has to be controlled.

Alternatively, the first reference frequency means comprises an external source generating a reference frequency signal.

The second-reference frequency means may comprise the oscillator the output frequency of which has to be controlled and a frequency divider able to divide said output frequency by three.

Alternatively, the second reference frequency means may comprise the external source generating a reference frequency signal and a frequency divider able to divide said output frequency by three.

Preferably, the dual mode oscillator comprises a colpitts-oscillator.

The invention also relates to a method to calibrate a temperature-compensated oscillator circuit defined above, comprising the following steps:

a. setting a predetermined temperature;

b. switching the first switch and the second switch in such a way that the dual mode oscillator oscillates in the second state and generates the fourth signal and the first counter is directly connected to the first reference frequency means;

c. counting the number of oscillations of the fourth signal by means of the second counter starting from a first initial value and counting the number of oscillations of the first signal with the predetermined reference frequency by means of the first counter starting from a second initial value;

d. stopping step c after a predetermined number of oscillations of the dual mode oscillator, after which the content of the first counter is equal to the predetermined reference frequency divided by the product of said predetermined number and the output frequency of the dual mode oscillator in its second state;

e. measuring the frequency of the fourth signal;

f. switching the second switch in such a way that the dual mode oscillator oscillates in its first state and generates the third signal and switching the first switch in such a way that the first counter is connected to said second reference frequency means;

g. counting downwards the number of oscillations of the third signal by means of the second counter during the time period lapsing as the first counter counts down to the second initial value;

h. storing the result of step g, i.e., storing the value of the second counter into a memory of the processor and storing a value equal to a predetermined desired output frequency of the said oscillator divided by the product of said predetermined number of oscillations of the dual mode oscillator and the output Frequency of the dual mode oscillator in its second state;

i. repeating steps a to h at a predetermined number of different temperatures in order to make up either a look up table or a polynom to determine the relationship between the output frequency of the said oscillator and the temperature.

Moreover, the present invention relates to a method to control the oscillator in the temperature-compensated oscillator circuit defined above, which temperature-compensated oscillator circuit is calibrated in accordance with the method defined above, comprising the following steps:

a. switching the second switch in such a way that the dual mode oscillator oscillates in its second state and generates the fourth signal and connecting the first counter directly to said oscillator through the first switch;

b. counting the number of oscillations of the fourth signal by means of the second counter starting from a first initial value and counting the number of oscillations of said oscillator by means of the first counter starting from a second initial value;

c. stopping step b after a predetermined number of oscillations of the dual mode oscillator and storing the content of the first counter;

d. switching the second switch in such a way that the dual mode oscillator oscillates in its First state and generates the third signal and connecting the first counter to the output of the frequency divider through the First switch, the output of said oscillator being connected to the frequency divider;

e. counting downwards the number of oscillations of the third signal by means of the second counter during the time period lapsing as the first counter counts down to the second initial value;

f. storing the result of step e, i.e., storing the value of the second counter into a memory of the processor;

g. determining calibration data using the value stored in step f;

h. determining an amount of compensation required for the oscillator;

i. transmitting a control signal to said oscillator to control its frequency at a desired value.

The invention will hereinafter be described with reference to the accompanying drawings which are not meant in a limiting sense, but only show an example of the invention and in which FIG. 1 shows a crystal oscillator having a temperature compensating circuit according to the invention;

Figure 1:
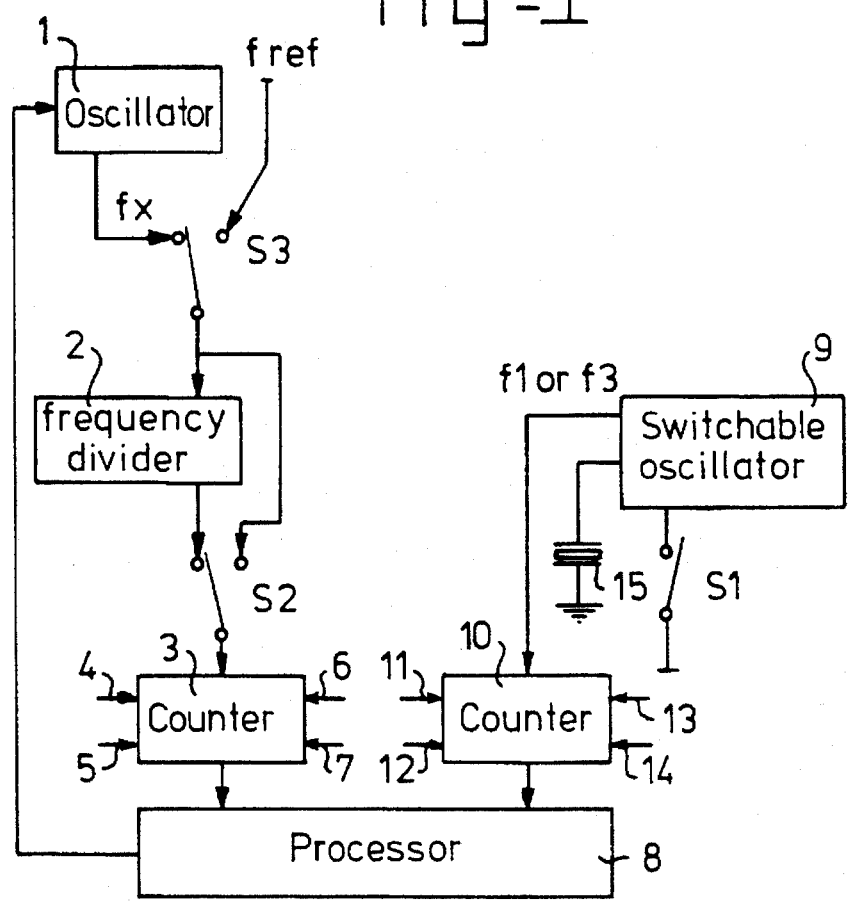
Figure 5:
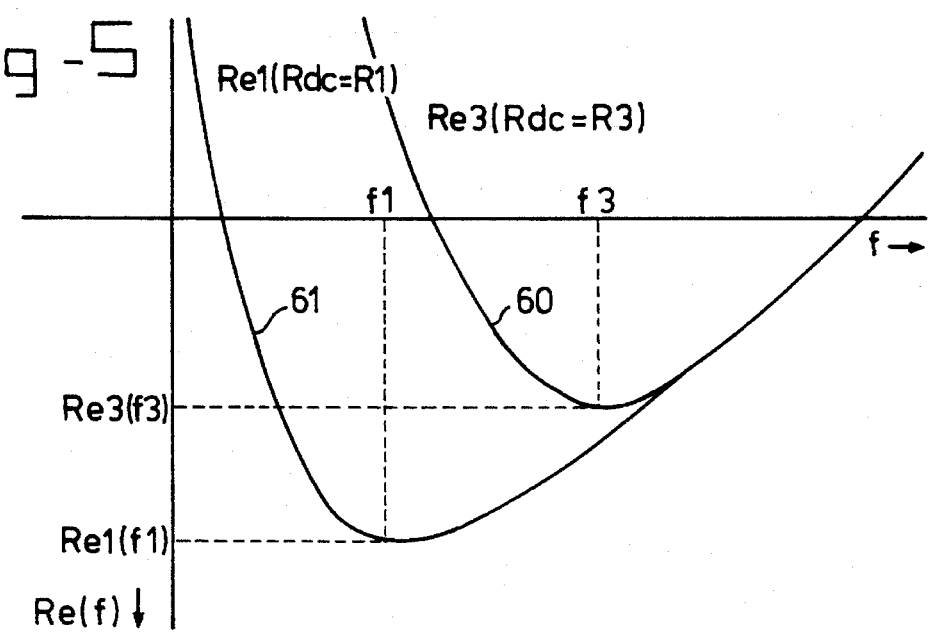
Figure 6:
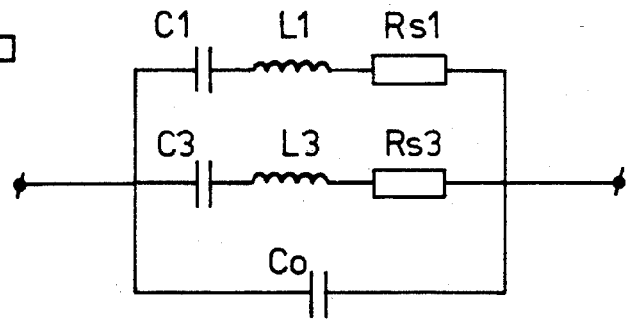
Figure 7:
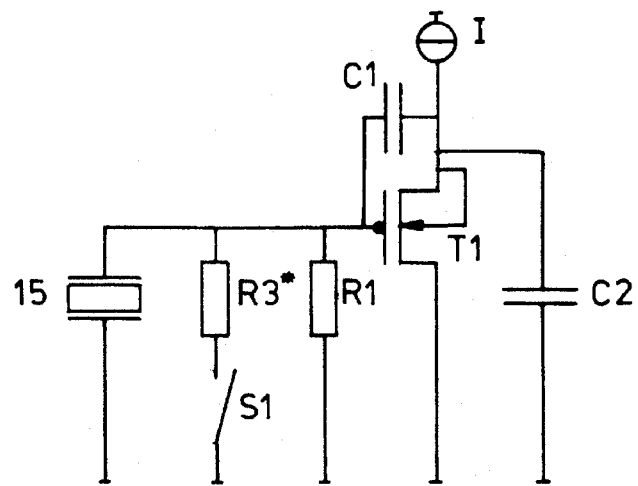

FIG. 5 explains the characteristic of the real part of the input impedance of a colpitts-oscillator used in the circuit of FIG. 1 as a function of the frequency;

FIG. 6 shows an electronic equivalent circuit of the colpitts-oscillator, used in the circuit of FIG. 1;

FIG. 7 shows an example of a colpitts-oscillator used in the circuit of FIG. 1.

In FIG. 1 the basic schedule of one example of the oscillator circuit to be controlled according to the invention is illustrated. With 1 the (crystal) oscillator to be controlled is indicated, which oscillator outputs a signal having a frequency fx to be controlled. The output of oscillator 1 is connected to a two state switch S3. The terminal of switch S3 to be switched may either be connected to the output of the oscillator 1 or to a signal having a reference frequency fref. The other terminal of switch S3 is fixed to a frequency divider 2, dividing the frequency of the input signal by three. Moreover, the other terminal of the switch S3 is connected to a counter 3 through a switch S2. The switch S2 has two states and connects, in its first state, the counter 3 to the switch S3 and, in its other state, the counter 3 to the output of the frequency divider 2. The counter 3 has four control inputs: a start input 4, a stop input 5, a reset input 6 and an up/down input 7. A signal to the start input 4 starts the counter, a signal to the stop input 5 stops the counter counting, a signal to the reset input 6 resets the counter to the initial value (for instance the value 0) and a signal to the up/down input 7 determines the counter to count upwards or downwards. The output of the counter is connected to a processor 8, comprising among others a memory.

It is robe noted that the switch S3 may be omitted in which case there is a direct connection between the frequency controlled oscillator 1 and the frequency divider 2. The reference signal fref is used to calibrate the circuit, however, the calibration may also be executed by means of the output signal of the oscillator 1 itself, as will be explained hereinafter.

Furthermore, there is provided a switchable oscillator 9 being preferably a colpitts-oscillator. The preferred embodiment of a colpitts-oscillator applied in the present case will be discussed below referring to FIG. 7. The colpitts-oscillator is connected to a crystal 15 and to a switch S1. At the output of the colpitts-oscillator 9 either a signal $\phi 1$ or $\phi 3$ appears. $\phi 1$ is the fundamental harmonic of the signal generated by the colpitts-oscillator and $\phi 3$ is a higher harmonic of $\phi 1$, preferably the thirdharmonic of $\phi 1$. The output of the colpitts-oscillator is connected to a counter 10 having four control inputs like counter 3: a start input 11, a stop input 12, a reset input 13 and an up/down input 14. The functioning of these four control inputs is the same as with counter 3 and is not repeated here. The output of the counter 10 is connected to the processor 8. The processor supplies an output signal to the oscillator 1 to be controlled, being, for instance, a voltage controlled oscillator, and thus controls its frequency.

In the circuit according to FIG. 1 the known principle of temperature compensating circuits of dual mode oscillators having high temperature stability is used. In such dual mode oscillators the crystal of the oscillator itself is used as temperature sensor. Theoretically, it may be proven that the function f3—3*f1, in which f1 is the fundamental frequency of the oscillation of the crystal and f3 is the frequency of the third harmonic of f1, varies substantially linearly with the temperature, so the quantity f3—3*f1 may easily be used for temperature compensation. Also in the circuit of FIG. 1 the quantity f3—3*f1 is used as temperature parameter, whereas f3 provides the frequency information.

Both during the calibration phase of the circuit according to FIG. 1 and during its operation phase the absolute temperature itself is not important, since the information about the absolute temperature is continuously provided by measuring the value of the signal f3—3*f1. Essential to the circuit according to the invention is that the signals f3 and f1 are not available simultaneously, but alternately during short time periods. These time periods are just long enough to measure the frequency of the colpitts-oscillator 9 with enough accuracy. The switch S1 serves to generate the signals f1 and f3 alternately. When the switch S1 is open, as shown in FIG. 1, the colpitts-oscillator 9 oscillates with frequency f1, whereas it oscillates with frequency f3 when the switch S1 is closed. This will be further explained hereinafter referring to FIG. 7.

Measuring both frequencies f1 and f3 is done by means of the processor 8 and the counter 10. Furthermore, for the measurement the output signal fx of the oscillator 1 to be controlled is used. Thus, the oscillator 1 has two functions: one as an oscillator to be controlled and one as a reference oscillator. The oscillator 1 is only required to supply an output signal with a stable frequency during a short time period.

Figure 2:
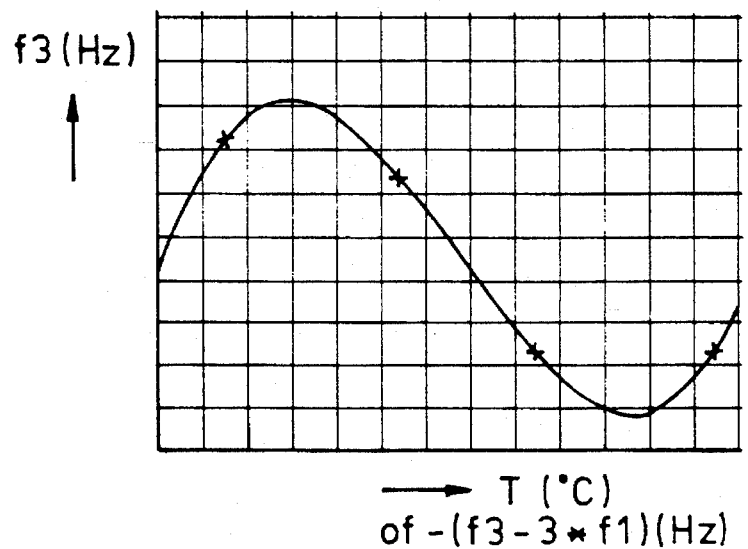
FIG. 2 shows the characteristic of a higher harmonic of a fundamental frequency of the compensating circuit according to FIG. 1 as function of the temperature.

After each measurement cycle, i.e., each time the quantity f3—3*f1 is measured, the oscillator 1 will be regulated in accordance with the quantity f3—3*f1. f3, being approximately a third order function of the temperature, which is known per se to the person skilled in the art, is used to calibrate the circuit according to FIG. 1. So, to calibrate the circuit according to FIG. 1, it is enough to determine four points of the relationship between f3 and the temperature T, since they determine entirely the third order function. As mentioned above, it also holds that the value of f3—3*f1 varies linearly with temperature. Therefore, the function f3=f(f3—3*f1) also has to be a third order function. So, to the calibration it may also suffice to determine four points of the function f3=f(f3—3*f1). When a more accurate approximation than a third order function is required, of course, more points of this function have to be measured to determine in that way a higher order approximation. FIG. 2, in which the horizontal axis of the diagram either shows the temperature T or the quantity −(f3—3*f1) and the vertical axis shows the value of f3, further illustrates this.

Figure 3:
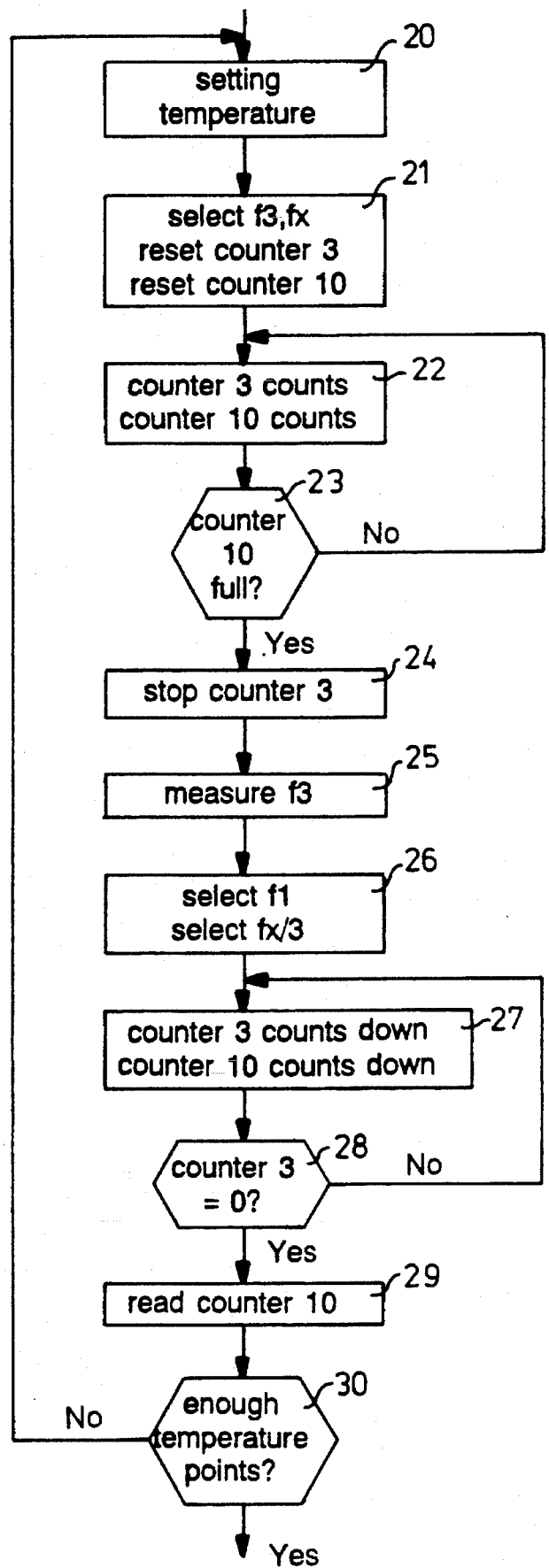
FIG. 3 shows a flow chart corresponding to the calibration of the circuit according to FIG. 1.

FIG. 3 shows a flow chart to calibrate the circuit of FIG. 1, the switch S3 being switched to connect the frequency controlled oscillator I to the frequency divider 2. In step 20 a predetermined desired temperature is set, in this case one of the four temperatures to determine the curve of FIG. 2. Next, in step 21 f3 and fx are selected by closing the switch S1 and switching the switch S2 to the right in FIG. 1 and switching the switch S3 to the left in FIG. 1, respectively. Then both counters 3 and 10 are reset on the initial value. In steps 22 and 23 the counters 3 and 10 are counting, the counter 3 counting with the frequency fx and the counter 10 counting with the frequency f3. Counting continues until counter 10 is full, after which counter 3 is directly stopped. The content of counter 10 is a measure of the value of f3 being determined in step 25 in the processor 8. Then, in step 26 f1 and fx/3 are selected by opening the switch S1, switching the switch S2 in FIG. 1 to the left and switching switch S3 in FIG. 1 also to the left, respectively. In steps 27 and 28 counter 3 counts downwards with the frequency fx/3 and counter 10 counts downwards with the frequency f1. This continues until the counter 3 reaches the initial value. Then, in step 29, the content of counter 10 is read directly. Since the frequency fx in frequency divider 3 is divided by 3, counting downwards has lasted three times as long as counting upwards in the first part at the steps 22 and 23. Therefore, the content of counter 10 now corresponds to f3—3*f1 (and the content is a measure for the temperature). Since at step 25 the value f3 has become available now the first value of the curve of FIG. 2 may be filled in. The cycle of FIG. 3 is repeated as long as desired, e.g., four times for a third order approximation.

Thus, during the calibration according to the scheme of FIG. 3 the oscillator 1 to be controlled is used as reference oscillator. This is somewhat complicated. In practice the reference signal Vref having a predetermined reference frequency fref may also be used instead. Then, in the scheme of FIG. 3 in step 21 instead of "select fx" one has to read: "select fref" and in step 26 instead of "select fx/3": "Select fref/3". The commands "select fref" and "select fref/3" respectively correspond to switching the switch S2 in FIG. 1 to the right and to switch the switch S3 in FIG. 1 to the right, and to switch the switch S2 in FIG. 1 to the left and to switch the switch S3 in FIG. 1 to the right, respectively.

It is to be observed that: f3 and f1 are therefore measured after one another to determine the function f3—3*f1. Switching the switches S1, S2 and S3 occurs about once per second, so usual temperature fluctuations may be easily followed. Only during very fast temperature changes the compensation circuit is not reliable.

In the usual operation mode the measured values from FIG. 2 may be used. It is also possible to convert the measured (four) values into coefficients of the (third order) polynomial or to make up a "look up" table. The determined values will then have to be converted into a control Signal for the oscillator 1.

Figure 4:
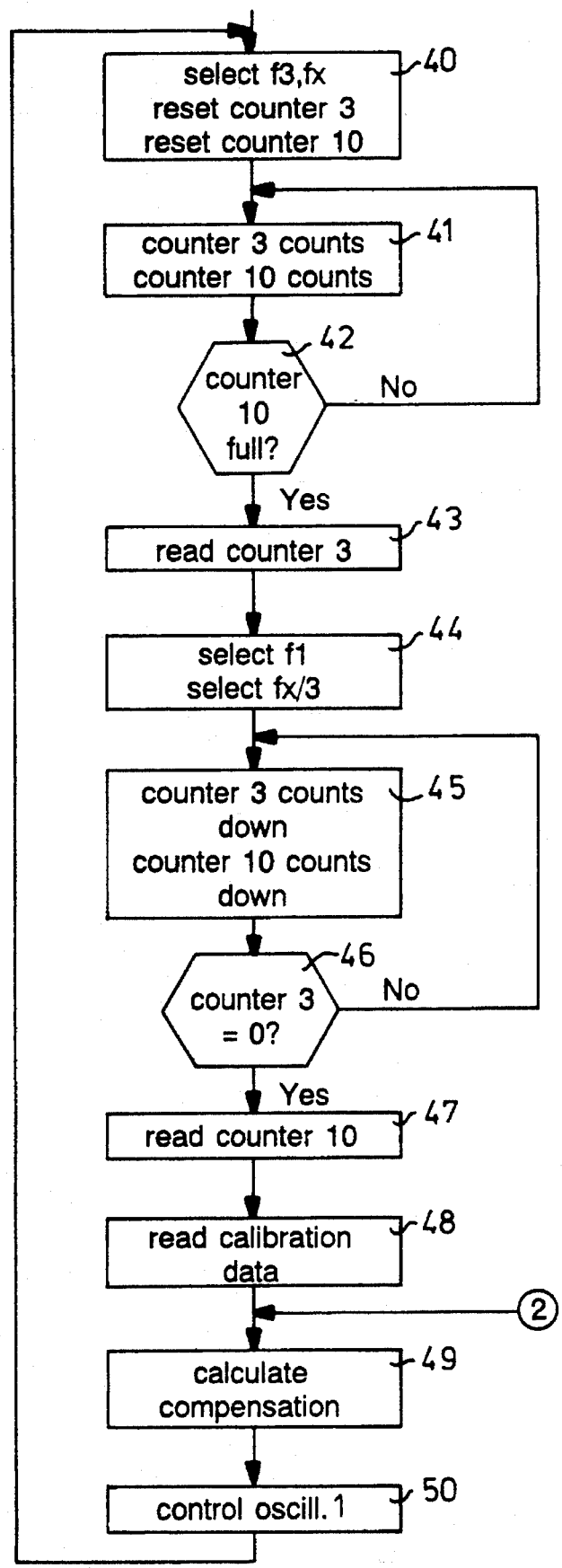
FIG. 4 shows a flow chart corresponding to the operation mode of the circuit according to FIG. 1.

FIG. 4 shows a flow chart for the operation mode of the circuit according to FIG. 1. In step 40 the signals f3 and fx are selected by closing the switch S1, switching the switch S2 to the right in FIG. 1 and switching the switch S3 to the left in FIG. 1. Besides, in this step beth counters 3 and 10 are reset to their initial value. In steps 41 and 42 beth counters 3 and 10 are counting, counter 3 counting with the frequency fx and counter 10 counting with the frequency f3, until counter 10 is full. Then, in step 43 counter 3 is read directly supplying the value fx. Then, counter 10 comprises a value corresponding to f3. In step 44 f1 and fx/3 are selected by opening the switch S1, switching S2 to the left in FIG. 1 and switching the switch S3 to the left in FIG. 1. In steps 45 and 46 beth counters 3 and 10 are counting downwards: counter 3 counting with the frequency fx/3 and counter 10 counting with the frequency f1. Counting down stops when counter 3 reaches the initial value. Then, like during the calibration cycle, counter 10 comprises a value corresponding to f3—3*f1. The content of counter 10 is read in step 47 and stored. The calibration data corresponding to this value of f3—3*f1 are determined in step 48, for instance, by means of the look up table or the calculated third order function. In step 49 the required compensation of the oscillator to be controlled is determined, which is possible because in step 43 the value fx is determined and in step 47 the value f3—3*f1 is determined, so the relationship between them is also known. At last, in step 50 a regulating signal is applied to the oscillator 1.

The way in which is switched between the signals f1 and f3 is essential to the compensation circuit. The colpitts-oscillator 9 realized in CMOS technology, as shown in FIG. 7, and forming a parallel resonance circuit with the crystal 15, constitutes the basic circuit. The application of parallel resonance has the advantage that there may be applied a high impedance circuit reducing the dissipated power.

The colpitts-oscillator of FIG. 7 comprises a crystal connected in parallel to a resistor R3 and a resistor R1. Resistor R3 is connected to ground through a switch S1. The signal supplied by the crystal 15 is applied to the gate electrode of a PMOS transistor T1, the drain electrode of which is connected to ground and the source electrode of which is also connected to ground through a capacitor C2. Besides, there is provided a capacitor C1 between the gate and the source electrode of transistor T1 and the source electrode receives a predetermined current from a current source Z. The colpitts-oscillator of FIG. 7 illustrates just one example of an oscillator being appropriate to be used as a switchable oscillator 9. As to the oscillator used it is only important that it may switch from a stable oscillation in the fundamental harmonic to a stable oscillation in a higher harmonic, preferably the third harmonic, in a comparatively short time–for instance 1 second–by switching the switch S1.

Although a colpitts-oscillator as such is known to a person skilled in the art, the following is to be noted with respect to the colpitts-oscillator used. By means of comparatively simple network analysis it may be proven that a colpitts-oscillator may be conceived as a negative resistor in series with a capacitor in the frequency range around the oscillator frequency. This negative resistor compensates the resonance resistance of the crystal resulting in the oscillation.

The curve of the real part of the input impedance [Re(f)] of the oscillator as a function of the frequency strongly depends on the DC input resistance [Rdc] of the circuit for the DC input resistance (also) determines the position of a zero point of Re(f).

In FIG. 5 the curve of the real part of the input impedance of two values of Rdc is shown. If Rdc decreases Re(f) will become less negative for low frequencies. Xn other words, in FIG. 7 a lower DC input resistance Rdc of the colpitts-oscillator corresponds to the curve 60 than to the curve 61. So, there is such a Rdc=R1, that there is a minimum in the curve for a frequency f1. There is also a Rdc=R3 for which there is a minimum in the curve at a frequency f3.

With respect to modelling a fundamental harmonic and a third harmonic, a crystal has an electrical equivalent circuit comprising the parallel circuit of two LCR circuits (FIG. 6). By compensating the resistance of one of both circuits the crystal will oscillate at the corresponding frequency. Crystals meant to oscillate at the fundamental harmonic have a much lower resistance at this fundamental harmonic than at the third harmonic. Therefore, such a crystal when connected in an oscillator circuit will preferably oscillate at the fundamental frequency. A crystal realized to oscillate at a harmonic frequency will show a lower resonance resistance at this harmonic frequency.

If f1 (FIG. 5) corresponds to the fundamental harmonic of a crystal and |Re1(f1)|>Rs1 the oscillator may oscillate at frequency f1 (with respect to Rs1 see FIG. 6). If f3 equals a harmonic (e.g., the third harmonic) of the same crystal and |Re3(f3)|>Rs3 the oscillator may oscillate at f3 (with respect to Rs3 see FIG. 6). If R3 and the crystal are connected to the oscillator the circuit will oscillate at frequency f3, because |Re3(f3)|>Rs3. |Re3(f1)| will be small or even positive, therefore the oscillator will not operate at frequency f1. If R1 and the crystal are connected the oscillator will oscillate at frequency f1, since |Re1(f1)|>>Rs1. Although also |Re1(f3)|>Rs3 holds the oscillator will still oscillate at frequency f1, since |Re1(f1)/Rs1|>>|Re1(f3)/Rs3|. By now switching between both resistors the oscillator will be switched between both frequencies. The most convenient solution is to apply a fixed resistor R1 and a switchable resistor R3*, so that R1//R3*=R3. Based on this the circuit of FIG. 7 is designed. Both the switch S1 and the resistors R1, R3* may easily be integrated in CMOS technology.

It will be understood by the person skilled in the art, that the colpitts-oscillator shown in FIG. 7 is just an example of a possible switchable oscillator in the circuit of FIG. 1. In accordance with the invention, for instance, also other modified colpitts-oscillators may be designed. The switchable oscillator 9 is only required to be able to switch from one stable oscillation to an other stable oscillation within a relatively short time period (for instance 1 second) by switching the switch S1.

We claim:

1. Temperature-compensated oscillator circuit comprising an oscillator (1) the output frequency (fx) of which has to be controlled, a processor (8) the output of which is connected to the oscillator (1), counter means (3, 10) connected to at least one input of the processor (8) and to temperature detecting oscillator means (9) which are able to generate a temperature dependent signal characterized in that the counter means comprises a first counter (3) and a second counter (10), the input of the first counter (3) being switchable through a first switch (S2) between first reference frequency means (1 or fref) able to generate a first signal with a predetermined reference frequency (fx or fref) and second reference frequency means (1, 2 or fref, 2) able to generate a second signal with a reference equal to the predetermined reference frequency divided by three, the second counter being connected to said temperature detecting oscillator means (9) which comprises a dual mode oscillator comprising a second, electronically controllable switch (S1) switchable between a first and a second state, wherein, during operation, said temperature detecting oscillator means (9) will generate a third signal with a predetermined fundamental frequency (f1) in the first state and a fourth signal with a frequency (f3) substantially equal to the third harmonic of said fundamental frequency in the second state.

2. Temperature-compensated oscillator circuit according to claim 1 characterized in that the first reference frequency means comprises the oscillator (1) the output frequency (fx) of which has to be controlled.

3. Temperature-compensated oscillator circuit according to claim 1 characterized in that the first reference frequency means comprises an external source generating a reference frequency signal (fref).

4. Temperature-compensated oscillator circuit according to claim 1 characterized in that the second reference frequency means comprises the oscillator (1) the output frequency (fx) of which has to be controlled and a frequency divider (2) able to divide said output frequency (fx) by three.

5. Temperature-compensated oscillator circuit according to claim 3 characterized in that the second reference frequency means comprises said external source generating a reference frequency signal (fref) and a frequency divider (2) able to divide said reference frequency (fref) by three.

6. Temperature-compensated oscillator circuit according to claim 1 characterized in that said dual mode oscillator (9) comprises a colpitts-oscillator.

7. Temperature-compensated oscillator circuit according to claim 6, wherein the colpitts-oscillator comprises a crystal (15) connected to a first resistor (R3*) and a second resistor (R1), the first resistor (R3*) being connected to ground through the second switch (S1) and the second resistor (R1) being directly connected to ground, said first and second resistors having such resistance values that when the second switch (S1) is closed the colpitts-oscillator will oscillate with a frequency three times as high as when the second switch (S1) is open.

8. Method to calibrate a temperature-compensated oscillator circuit according to claims 1, comprising the following steps:

a. setting a predetermined temperature (step 20);

b. switching the first switch (S2) and the second switch (S1) in such a way that the dual mode oscillator (9) oscillates in the second state and generates the fourth signal (f3) and the first counter (3) is directly connected to the first reference frequency means (1 or fref) (step 21);

c. counting the number of oscillations of the fourth signal by means of the second counter (10) starting from a first initial value and counting the number of oscillations of the first signal with the predetermined reference frequency (fx or fref) by means of the first counter (3) starting from a second initial value (step 22);

d. stopping step c after a predetermined number of oscillations of the dual mode oscillator (9), after which the content of the first counter (3) is equal to the predetermined reference frequency (fx or fref) divided by the product of said predetermined number (N) and the output Frequency (f3) of the dual mode oscillator (9) in its second state;

e. measuring the frequency (f3) of the fourth signal (step 25);

f. switching the second switch (S1) in such a way that the dual mode oscillator (9) oscillates in its first state and generates the third signal (f1) and switching the first switch (S2) in such a way that the first counter (3) is connected to said second reference frequency means (1, 2 or fref, 2) (step 26);

g. counting downwards the number of oscillations of the third signal (f1) by means of the second counter (10) during the time period lapsing as the first counter (3) counts down to the second initial value (steps 27 and 28);

h. storing the result of step g, i.e., storing the value of the second counter (10) into a memory of the processor (8) and storing a value equal to a predetermined desired output frequency of the said oscillator (1) divided by the product of said predetermined number of oscillations of the dual mode oscillator (9) and the output frequency (f3) of the dual mode oscillator (9) in its second state (step 29);

i. repeating steps a to h at a predetermined number of different temperatures in order to make up either a look up table or a polynom to determine the relationship between the output frequency of the said oscillator (1) and the temperature (step 30).

9. Method according to claim 8, further including a method to control the oscillator (1) comprising the following steps:

a. switching the second switch (S1) in such a way that the dual mode oscillator (9) oscillates in its second state and generates the fourth signal (f3) and connecting the first counter (3) directly to said oscillator (1) through the first switch (S2) (step 40);

b. counting the number of oscillations of the fourth signal by means of the second counter (10) starting from a first initial value and counting the number of oscillations (fx) of said oscillator (1) by means of the first counter (3) starting from a second initial value (step 41);

c. stopping step b after a predetermined number of oscillations of the dual mode oscillator (9) and storing the content of the first counter (3) (steps 42, 43);

d. switching the second switch (S1) in such a way that the dual mode oscillator (9) oscillates in its first state and generates the third signal (f1) and connecting the first counter (3) to the output of the frequency divider (2) through the first switch (S2), the output of said oscillator (1) being connected to the frequency divider (2) (step 44);

e. counting downwards the number of oscillations of the third signal (f1) by means of the second counter (10) during the time period lapsing as the first counter (3) counts down to the second initial value (steps 45, 46);

f. storing the result of step e, i.e., storing the value of the second counter (10) into a memory of the processor (8) (step 47);

g. determining calibration data using the value stored in step f (step 48);

h. determining an amount of compensation required for the oscillator (1) (step 49);

i. transmitting a control signal to said oscillator (1) to control its frequency (fx) at a desired value (step 50).

* * * * *